(12) United States Patent
Ning et al.

(10) Patent No.: US 9,384,318 B2
(45) Date of Patent: Jul. 5, 2016

(54) MASK ERROR COMPENSATION BY OPTICAL MODELING CALIBRATION

(71) Applicant: Globalfoundries Inc., Grand Cayman (KY)

(72) Inventors: Guoxiang Ning, Ballston Lake, NY (US); Paul Ackmann, Gansevoort, NY (US); Chin Teong Lim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 215 days.

(21) Appl. No.: 14/263,340

(22) Filed: Apr. 28, 2014

(65) Prior Publication Data

US 2015/0310157 A1    Oct. 29, 2015

(51) Int. Cl.
*G06F 17/50* (2006.01)

(52) U.S. Cl.
CPC .................. *G06F 17/5081* (2013.01)

(58) Field of Classification Search
USPC ......................................................... 716/53
See application file for complete search history.

(56) References Cited

U.S. PATENT DOCUMENTS

| 2003/0084420 | A1* | 5/2003 | Aton | G03F 7/705 716/53 |
| 2005/0148195 | A1* | 7/2005 | Koehle | G03F 1/36 438/709 |
| 2007/0077526 | A1* | 4/2007 | Finders | G03F 1/144 430/322 |
| 2009/0091729 | A1* | 4/2009 | Marokkey | G03F 7/70208 355/67 |
| 2010/0146465 | A1* | 6/2010 | Berkens | G06F 17/5081 716/52 |
| 2011/0315527 | A1* | 12/2011 | Dang | B81C 1/00476 200/181 |
| 2013/0119491 | A1* | 5/2013 | Luce | H01L 21/84 257/416 |
| 2013/0139116 | A1* | 5/2013 | Chow | G03F 1/36 716/51 |
| 2013/0275926 | A1* | 10/2013 | Wang | G03F 1/36 716/53 |

* cited by examiner

*Primary Examiner* — Mohammed Alam
(74) *Attorney, Agent, or Firm* — Ditthavong & Steiner, P.C.

(57) ABSTRACT

Methodologies and an apparatus for enabling OPC models to account for errors in the mask are disclosed. Embodiments include: determining a patterning layer of a circuit design; estimating a penetration ratio indicating a mask corner rounding error of a fabricated mask for forming the patterning layer in a fabricated circuit; and determining, by a processor, a compensation metric for optical proximity correction of the circuit design based on the penetration ratio.

17 Claims, 5 Drawing Sheets

MASK ERROR COMPENSATION BY OPTICAL MODELING CALIBRATION

TECHNICAL FIELD

The present disclosure relates to a manufacture of semiconductor devices. The present disclosure is particularly applicable to improving mask error compensation for the 28 nanometer (nm) technology node and beyond.

BACKGROUND

In the fabrication of semiconductor devices, methods may utilize optical proximity correction (OPC) models to compensate for image errors and process effects in a resulting device. However, such models may assume a perfect mask pattern. Penetration ratio basically refers to a mask corner rounding effect which arises from imperfect mask fabrication. Errors in the mask, for instance, a 1 nm error, may result in errors of five times in the substrate, for instance, a 5 nm error. Existing mask parameters in conventional OPC software are unable to capture the mask corner rounding effect.

A need therefore exists for methodologies and an apparatus for enabling OPC models to account for errors in the mask such as the corner rounding effect.

SUMMARY

An aspect of the present disclosure is a method of enabling OPC models to account for errors in the mask by, inter alia, determining a compensation metric for optical proximity correction of the circuit design based on a penetration ratio.

Another aspect of the present disclosure is an apparatus configured to enable OPC models to account for errors in the mask by, inter alia, determining a compensation metric for optical proximity correction of the circuit design based on a penetration ratio.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a patterning layer of a circuit design; estimating a penetration ratio indicating a mask corner rounding error of a fabricated mask for forming the patterning layer in a fabricated circuit; and determining, by a processor, a compensation metric for optical proximity correction of the circuit design based on the penetration ratio.

Aspects include: determining a design area of the patterning layer; and determining a mask area of a mask design for forming the patterning layer, wherein the estimating is based on a difference between the mask area and the design area. Additional aspects include determining a ratio between the mask area and the design area, wherein the estimating is based on the ratio. Further aspects include determining a predefined penetration ratio designated for the circuit design, wherein the estimating of the penetration ratio is based on the predefined penetration ratio. Some aspects include: determining an area of a hole of the patterning layer or an area of a vertical integration access feature of the patterning layer, and determining, based on the area of a hole or area of a vertical integration access feature, whether to select a predefined penetration ratio or to initiate a calculation of a penetration ratio, wherein the estimating is based on the determining of whether to select the predefined penetration ratio or to initiate the calculation of the penetration ratio. Additional aspects include generating a correction factor based on the penetration ratio, the correction factor indicating a mask corner rounding difference between a mask design for forming the patterning layer and the fabricated mask, wherein the compensation metric is based on the correction factor. Further aspects include determining an optical proximity correction repair algorithm for the circuit design, wherein the determining of the compensation metric includes modifying a result of the optical proximity correction repair algorithm based on the correction factor. Some aspects include: determining an optical parameter of the repair algorithm based on the patterning layer; estimating a rate of change of the repair algorithm based on the optical parameter; and determining a second correction factor based on the penetration ratio, wherein the compensation metric is further based on the rate of change of the repair algorithm and the second correction factor.

Another aspect of the present disclosure is an apparatus including: a processor; and a memory including computer program code for a program, the memory and the computer program code configured to, with the processor, cause the apparatus to perform the following, determine a patterning layer of a circuit design; estimate a penetration ratio indicating a mask corner rounding error of a fabricated mask for forming the patterning layer in a fabricated circuit; and determine a compensation metric for optical proximity correction of the circuit design based on the penetration ratio.

Some aspects include an apparatus further caused to: determine a design area of the patterning layer; and determine a mask area of a mask design for forming the patterning layer, wherein the estimation is based on a difference between the mask area and the design area. Additional aspects include an apparatus further caused to determine a ratio between the mask area and the design area, wherein the estimation is based on the ratio. Further aspects include an apparatus further caused to determine a predefined penetration ratio designated for the circuit design, wherein the estimation of the penetration ratio is based on the predefined penetration ratio. Some aspects include an apparatus further caused to: determine an area of a hole of the patterning layer or an area of a vertical integration access feature of the patterning layer, and determine, based on the area of a hole or area of a vertical integration access feature, whether to select a predefined penetration ratio or to initiate a calculation of a penetration ratio, wherein the estimation is based on the determining of whether to select the predefined penetration ratio or to initiate the calculation of the penetration ratio. Additional aspects include an apparatus further caused to generate a correction factor based on the penetration ratio, the correction factor indicating a mask corner rounding difference between a mask design for forming the patterning layer and the fabricated mask, wherein the compensation metric is based on the correction factor. Further aspects include an apparatus further caused to determine an optical proximity correction repair algorithm for the circuit design, wherein the determination of the compensation metric includes modifying a result of the optical proximity correction repair algorithm based on the correction factor. Some aspects include an apparatus further caused to: determine an optical parameter of the repair algorithm based on the patterning layer; estimate a rate of change of the repair algorithm based on the optical parameter; and determine a second correction factor based on the penetration ratio, wherein the compensation metric is further based on the rate of change of the repair algorithm and the second compensation metric.

Another aspect of the present disclosure is a method including: determining a patterning layer of a circuit design; comparing a predefined area to an area of a hole of the patterning layer or an area of a vertical integration access feature of the patterning layer, determining whether to select a predefined penetration ratio designated for the circuit design or to initiate a calculation of a penetration ratio based the comparing; estimating a penetration ratio based on the determining of whether to select or to initiate the calculation; determining a correction factor based on the penetration ratio, the correction factor indicating a mask corner rounding difference between a mask design for forming the patterning layer and a fabricated mask design of the mask design; and generating, by a processor, a compensation metric for optical proximity correction of the circuit design based on the correction factor.

Some aspects include: determining a design area of the patterning layer; determining a mask area of the mask design; and determining a ratio between the mask area and the design area, wherein the estimating is based on the ratio. Further aspects include determining an optical proximity correction repair algorithm for the circuit design, wherein the generating of the compensation metric includes modifying a result of the optical proximity correction repair algorithm based on the correction factor. Some aspects include: determining an optical parameter of the repair algorithm based on the patterning layer; estimating a rate of change of the repair algorithm based on the optical parameter; and determining a second compensation metric based on the penetration ratio, wherein the correction factor is further based on the rate of change of the repair algorithm and the second compensation metric.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of mask corner rounding effect errors attendant upon applying current OPC models. In accordance with embodiments of the present disclosure, the problems are solved, for instance by, inter alia, determining a compensation metric for optical proximity correction of the circuit design based on a penetration ratio.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
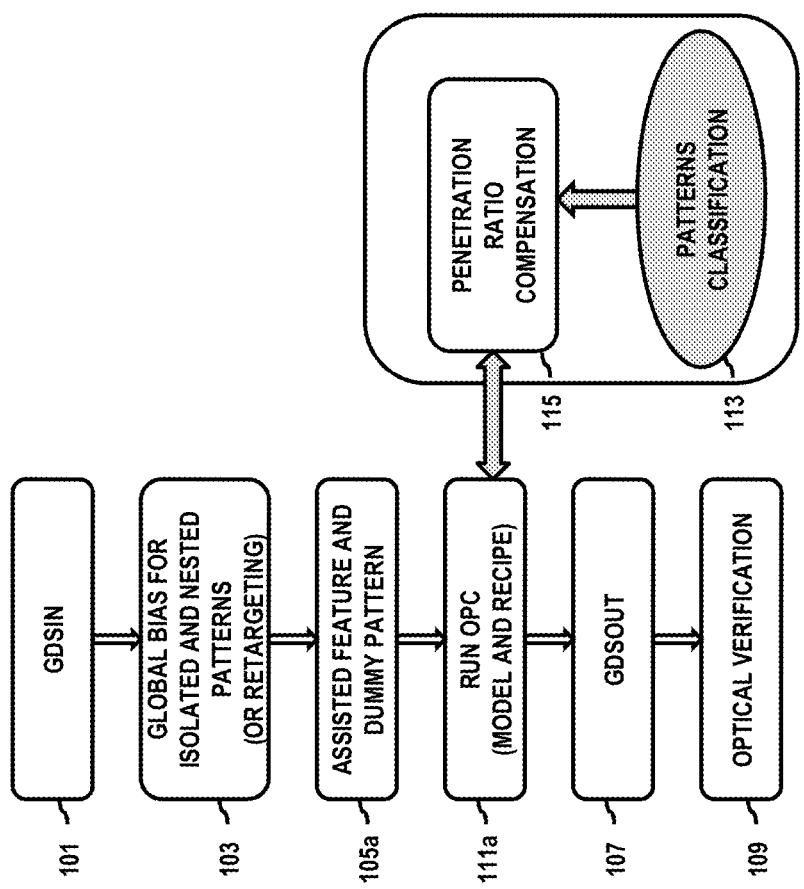
FIGS. 1A and 1B illustrate a rule-based process and a model based process, respectively, according to exemplary embodiments.
Figure 1B:
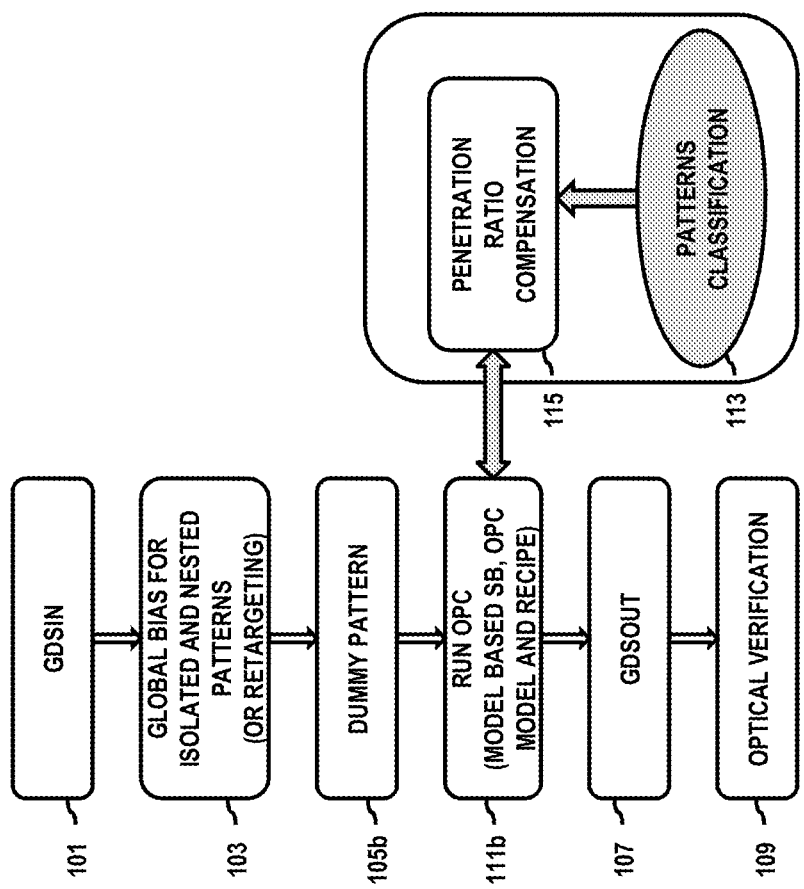

FIGS. 1A and 1B illustrate a rule-based assisted features process and a model based assisted features process, respectively, according to exemplary embodiments. FIG. 1A illustrates a rule-based assisted features process using traditional processes including a global design input step 101, a global bias step 103 for isolated and nested patterns (or retargeting), an assisted feature and dummy pattern step 105a, a global design output step 107, and optical verification step 109. Moreover, FIG. 1A further includes a run OPC step 111a between the assisted feature and dummy pattern step 105a and the global design output step 107. The run OPC step 111a uses a model and recipe that receives an input from a pattern classification step 113 and penetration ratio compensation step 115. The pattern classification step 113 includes determining a patterning layer of a circuit design and estimating a penetration ratio indicating a mask corner rounding error of a fabricated mask for forming the patterning layer in a fabricated circuit. The penetration ratio compensation step 115 determines a compensation metric for optical proximity correction of a circuit design according to a determined penetration ratio from the pattern classification step 113.

FIG. 1B illustrates a model based process using traditional processes similar to those of FIG. 1A except that an assisted feature of step 105a is omitted and a rule, model, or rule and model based scatter bar (SB) and/or sub-resolution assist features and dummy pattern 105b is included. Similar to FIG. 1A, FIG. 1B further includes a run OPC step 111b, between dummy pattern 105b and global design output step 107. Run OPC step 111b uses OPC model, and recipe that receives an input from pattern classification step 113 and penetration ratio compensation step 115. For instance, run OPC step 111a inserts a SB based on a fixed set of rules (e.g., rules based SB) and run OPC step 111b inserts a SB either based on a result output of simulated optical behavior of particular layout during an OPC step (e.g., model based SB) or based on a fixed set of rules (e.g., rules based SB). Model based SB may address uncertainty resulting from new layout which may escape the coverage of rule based SB due to its limitation.

Figure 2:
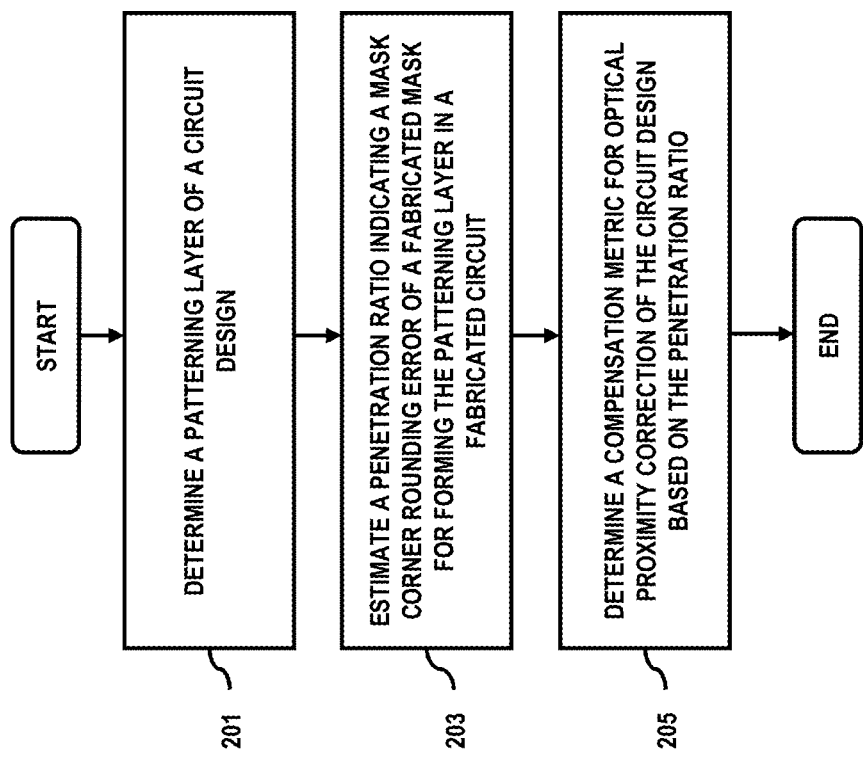
FIG. 2 is a flowchart of a process for enabling OPC models to account for errors in the mask, according to an exemplary embodiment.

FIG. 2 is a flowchart of a process for enabling OPC models to account for errors in the mask, according to an exemplary embodiment. In step 201, a patterning layer of a circuit design is determined. Additionally, a type of layer, such as M1, M2, contact, or vertical-integration-access (VIA), is determined.

Moreover, a layer designation may be determined, such as 1× indicating a small separation distance of features (e.g., 20 nm), 1.3× indicating a medium separation distance of features (e.g., 30 nm), and 2× indicating a large separation distance of features (e.g., 60 nm). Next, in step 203, an estimation of a penetration ratio is determined for the patterning layer. For instance, the penetration ratio may be estimated using equation 1, wherein the "Design Area" is a design area of the patterning layer and the "Mask Area" is a surface area of a mask design for patterning the patterning layer.

Penetration Ratio (%)=(Design Area−Mask Area)/
(Design Area)      Equation 1

In step 205, a compensation metric for optical proximity correction is determined based on the penetration ratio. For example, for holes for contact and other VIA layers, the compensation metric may be as shown in equation 2 but not limited to the example, where $I_c$ is a compensation metric (e.g., current intensity), $A_c$ is a correction factor, $f(\ )$ is a conventional repair algorithm, $i_{min}$ is a minimum current intensity parameter, $i_{max}$ is a maximum current intensity parameter, slope is a change intensity parameter over distance, and other optical parameters include but are not limited to like contrast, $2^{nd}$ order or higher order of those optical parameters.

$I_c = A_c \times f(i_{min}, i_{max}, \text{Slope}, \text{other optical parameters} \ldots)$      Equation 2

Moreover, the correction factor $A_c$ is defined by Equation 3.

$A_c = 1 - (\text{penetration ratio})$      Equation 3

Accordingly, a low penetration ratio results in a correction factor which indicates a small mask corner rounding difference between a mask design for forming a patterning layer and a fabricated mask design of the mask design. Similarly, a high penetration ratio results in a correction factor which indicates a high mask corner rounding difference between a mask design for forming a patterning layer and a fabricated mask design of the mask design. Moreover, as applied in equation 2, the correction factor ('$A_c$') modifies a result of the optical proximity correction repair algorithm ('$f(\ )$').

Alternatively, the correction factor may have increased accuracy of 2D structures, to fix a development phase effect during OPC calibration, by use of a Taylor's first-order extension as shown in equations 4 and 5, where $I_c$, $f(\ )$, $A_c$, $i_{min}$, $i_{max}$, and other optical parameters are the same as in equation 2, and $f'(\ )$ is a rate of change of the repair algorithm and $(A_c)^2$ is a second correction factor.

$I_c = A_c \times f(i_{min}, i_{max}, \text{Slope}, \text{other optical parameters} \ldots) + (A_c)^2 f'(i_{min}, i_{max}, \text{Slope}, \text{other optical parameters} \ldots)$      Equation 4

Where $f' = df/di_{min} + df/di_{max} + df/d\text{Slope} + \ldots$      Equation 5

Equations 4 and 5 may be simplified to reduce a run time by treating f' as a first derivative of one or two optical parameters as shown in equation 6, resulting in equation 7.

$f' = df/di_{max} + df/di_{min}$ or $f' = df/di_{max}$      Equation 6

$I_c = A_c \times f(i_{min}, i_{max}, \text{Slope}, \text{other optical parameters} \ldots) + (A_c)^2 f'(i_{min}, i_{max})$      Equation 7

The purpose of adding the first order extension of f is to accurately fix delta between the actual reticle aerial image and the idealized image.

Figure 3:
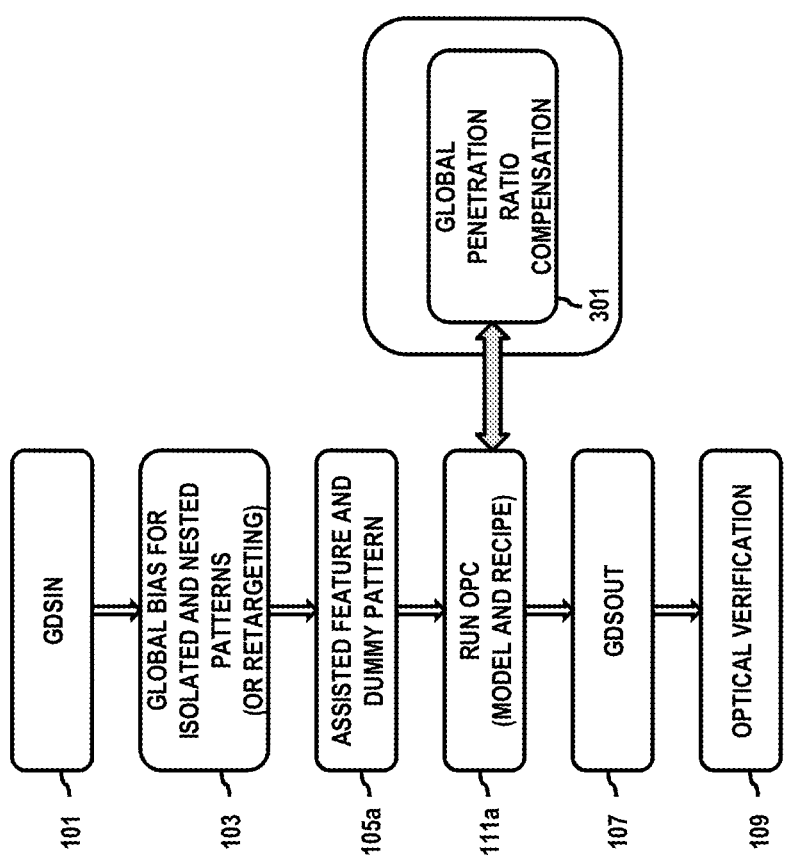
FIG. 3 illustrates a rule-based process using a global penetration ratio, according to an exemplary embodiment.

FIG. 3 illustrates a model based process using traditional processes similar to those of FIG. 1A except that pattern classification step 113 and penetration ratio compensation step 115 are replaced with a global penetration ratio value step 301. Similarly, FIG. 1B may be modified to omit steps 111 and 113 and to further include step 301. Step 301 performs the process of FIG. 2 except that a global penetration ratio value is substituted for the calculated correction factor ($A_c$). The global value may be an average of all patterning penetration ratios. Use of the global penetration ratio may allow for a simple and reduced run time. Moreover, the global penetration ratio value may be used for 1.3× and 2× patterning layers, where the error is not as critical to yield compared to 1× patterning layers. For instance, the global penetration ratio may be selected instead of initiating a calculation when the patterning layers are designated to be 1.3× or 2× or if a hole (e.g., VIA, contact, etc.) has an area larger than a predefined area (e.g., 400 $nm^2$).

Figure 4:
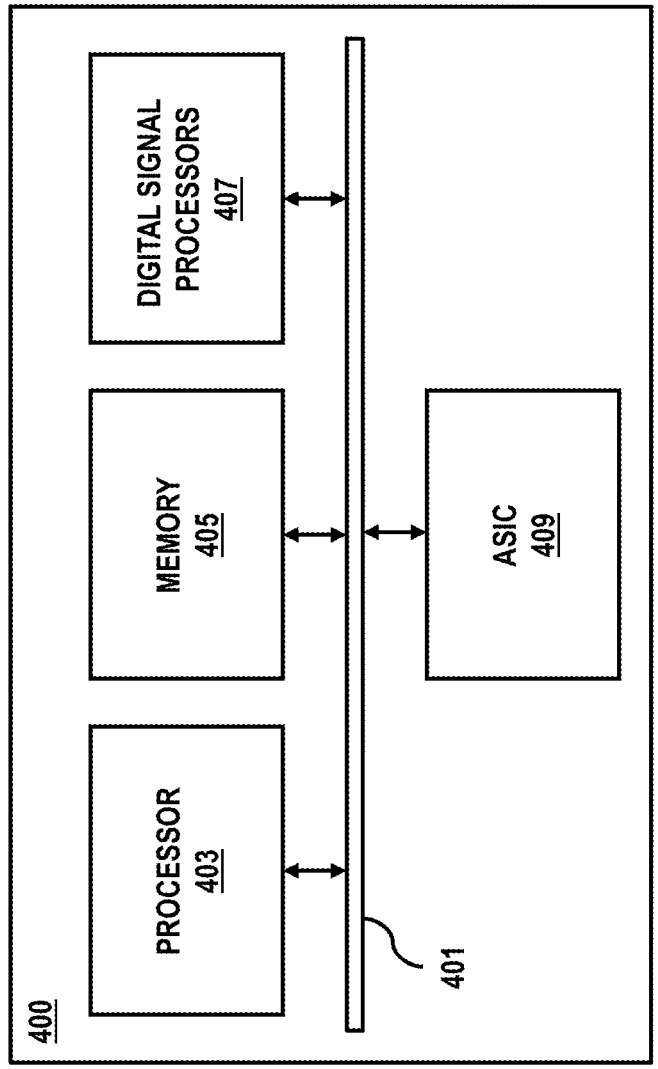
FIG. 4 illustrates a diagram of a chip set that can be used to implement exemplary embodiments.

FIG. 4 illustrates a diagram of a chip set that can be used to implement exemplary embodiments. Chip set 400 is programmed to enable OPC models to account for errors in the mask as described herein and includes, for instance, the processor and memory components described with respect to FIG. 4 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 400, or a portion thereof, constitutes a means for performing one or more steps of FIGS. 1 through 3.

The chip set 400 may include a communication mechanism such as a bus 401 for passing information among the components of the chip set 400. A processor 403 has connectivity to the bus 401 to execute instructions and process information stored in, for example, a memory 405. The processor 403 may include one or more processing cores with each core configured to perform independently. A multi-core processor enables multiprocessing within a single physical package. Examples of a multi-core processor include two, four, eight, or greater numbers of processing cores. Alternatively or in addition, the processor 403 may include one or more microprocessors configured in tandem via the bus 401 to enable independent execution of instructions, pipelining, and multithreading. The processor 403 may also be accompanied by one or more specialized components to perform certain processing functions and tasks such as one or more digital signal processors (DSP) 407, or one or more application-specific integrated circuits (ASIC) 409. A DSP 407 typically is configured to process real-world signals (e.g., sound) in real time independently of the processor 403. Similarly, an ASIC 409 can be configured to performed specialized functions not easily performed by a general purpose processor. Other specialized components to aid in performing the inventive functions described herein include one or more field programmable gate arrays (FPGA) (not shown), one or more controllers (not shown), or one or more other special-purpose computer chips.

The processor 403 and accompanying components have connectivity to the memory 405 via the bus 401. The memory 405 includes both dynamic memory (e.g., RAM, magnetic disk, writable optical disk, etc.) and static memory (e.g., ROM, CD-ROM, etc.) for storing executable instructions that when executed perform the inventive steps described herein. The memory 405 also stores the data associated with or generated by the execution of the inventive steps.

The embodiments of the present disclosure can achieve several technical effects, including increased accuracy of OPC, with minimal impact on OPC runtime, resulting in an improvement in a manufacturing yield of an IC. The present disclosure enjoys industrial applicability in any of various types of highly integrated semiconductor devices, particularly large IC designs utilizing gratings, particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor device, comprising:
   determining a patterning layer of a circuit design;
   estimating a penetration ratio indicating a mask corner rounding error of a fabricated mask for forming the patterning layer in a fabricated circuit;
   determining, by a processor, a compensation metric for optical proximity correction of the circuit design based on the penetration ratio;
   determining an area of a hole of the patterning layer or an area of a vertical integration access feature of the patterning layer,
   wherein the estimating a penetration ratio is based on determining whether to select a predefined penetration ratio or to initiate a calculation of the penetration ratio, and the determining of whether to select a predefined penetration ratio or to initiate a calculation of the penetration ratio is based on the area of a hole or area of a vertical integration access feature; and
   fabricating the semiconductor device with the circuit design corrected by the compensation metric.

2. The method according to claim 1, comprising:
   determining a design area of the patterning layer; and
   determining a mask area of a mask design for forming the patterning layer, wherein the estimating is based on a difference between the mask area and the design area.

3. The method according to claim 2, comprising:
   determining a ratio between the mask area and the design area, wherein the estimating is based on the ratio.

4. The method according to claim 1, comprising:
   determining a predefined penetration ratio designated for the circuit design, wherein the estimating of the penetration ratio is based on the predefined penetration ratio.

5. The method according to claim 1, comprising:
   generating a correction factor based on the penetration ratio, the correction factor indicating a mask corner rounding difference between a mask design for forming the patterning layer and the fabricated mask, wherein the compensation metric is based on the correction factor.

6. The method according to claim 5, comprising:
   determining an optical proximity correction repair algorithm for the circuit design, wherein the determining of the compensation metric comprises modifying a result of the optical proximity correction repair algorithm based on the correction factor.

7. The method according to claim 6, comprising:
   determining an optical parameter of the repair algorithm based on the patterning layer;
   estimating a rate of change of the repair algorithm based on the optical parameter; and
   determining a second correction factor based on the penetration ratio, wherein the compensation metric is further based on the rate of change of the repair algorithm and the second correction factor.

8. An apparatus for fabricating a semiconductor device, comprising:
   a processor; and
   a non-transitory memory including computer program code for a program,
   the non-transitory memory and the computer program code configured to, with the processor,
   cause the apparatus to perform the following,
   determine a patterning layer of a circuit design;
   estimate a penetration ratio indicating a mask corner rounding error of a fabricated mask for forming the patterning layer in a fabricated circuit;
   determine a compensation metric for optical proximity correction of the circuit design based on the penetration ratio;
   determine an area of a hole of the patterning layer or an area of a vertical integration access feature of the patterning layer;
   determine, based on the area of a hole of the patterning layer or area of a vertical integration access feature of the patterning layer, whether to select a predefined penetration ratio or to initiate a calculation of a penetration ratio, wherein the estimation is based on the determining of whether to select the predefined penetration ratio or to initiate the calculation of the penetration ratio; and
   fabricate the semiconductor device with the circuit design corrected by the compensation metric.

9. The apparatus according to claim 8, wherein the apparatus is further caused to:
   determine a design area of the patterning layer; and
   determine a mask area of a mask design for forming the patterning layer, wherein the estimation is based on a difference between the mask area and the design area.

10. The apparatus according to claim 9, wherein the apparatus is further caused to:
    determine a ratio between the mask area and the design area, wherein the estimation is based on the ratio.

11. The apparatus according to claim 8, wherein the apparatus is further caused to:
    determine a predefined penetration ratio designated for the circuit design, wherein the estimation of the penetration ratio is based on the predefined penetration ratio.

12. The apparatus according to claim 8, wherein the apparatus is further caused to:
    generate a correction factor based on the penetration ratio, the correction factor indicating a mask corner rounding difference between a mask design for forming the patterning layer and the fabricated mask, wherein the compensation metric is based on the correction factor.

13. The apparatus according to claim 12, wherein the apparatus is further caused to:
    determine an optical proximity correction repair algorithm for the circuit design, wherein the determination of the compensation metric comprises modifying a result of the optical proximity correction repair algorithm based on the correction factor.

14. The apparatus according to claim 13, wherein the apparatus is further caused to:
- determine an optical parameter of the repair algorithm based on the patterning layer;
- estimate a rate of change of the repair algorithm based on the optical parameter; and
- determine a second correction factor based on the penetration ratio, wherein the compensation metric is further based on the rate of change of the repair algorithm and the second compensation metric.

15. A method of fabricating a semiconductor device, comprising:
- determining a patterning layer of a circuit design;
- comparing a predefined area to an area of a hole of the patterning layer or an area of a vertical integration access feature of the patterning layer;
- determining whether to select a predefined penetration ratio designated for the circuit design or to initiate a calculation of a penetration ratio based the comparing, wherein penetration ratio refers to a mask corner rounding effect which arises from imperfect mask fabrication;
- estimating a penetration ratio based on the determining of whether to select or to initiate the calculation;
- determining a correction factor based on the penetration ratio, the correction factor indicating a mask corner rounding difference between a mask design for forming the patterning layer and a fabricated mask design of the mask design;
- generating, by a processor, a compensation metric for optical proximity correction of the circuit design based on the correction factor;
- determining an optical proximity correction repair algorithm for the circuit design, wherein the generating of the compensation metric comprises modifying a result of the optical proximity correction repair algorithm based on the correction factor; and
- fabricating the semiconductor device with the circuit design based on the modified result of the optical proximity correction repair algorithm.

16. The method according to claim 15, comprising:
determining a design area of the patterning layer;
determining a mask area of the mask design; and
determining a ratio between the mask area and the design area, wherein the estimating is based on the ratio.

17. The method according to claim 15, comprising:
determining an optical parameter of the repair algorithm based on the patterning layer;
estimating a rate of change of the repair algorithm based on the optical parameter; and
determining a second correction factor based on the penetration ratio, wherein the compensation metric is further based on the rate of change of the repair algorithm and the second correction factor.

* * * * *